United States Patent
Franke

(10) Patent No.: US 11,585,676 B2
(45) Date of Patent: Feb. 21, 2023

(54) MAGNETIC FIELD MEASURING DEVICE

(71) Applicant: Micronas GmbH, Freiburg (DE)

(72) Inventor: Joerg Franke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 3 days.

(21) Appl. No.: 15/290,406

(22) Filed: Oct. 11, 2016

(65) Prior Publication Data
US 2017/0102250 A1    Apr. 13, 2017

(30) Foreign Application Priority Data
Oct. 9, 2015    (DE) .................... 10 2015 013 022.6

(51) Int. Cl.
G01D 5/14    (2006.01)
G01R 33/07    (2006.01)

(52) U.S. Cl.
CPC ............. G01D 5/147 (2013.01); G01R 33/07 (2013.01); G01R 33/072 (2013.01)

(58) Field of Classification Search
CPC .................................................... G01D 5/147
See application file for complete search history.

(56) References Cited

U.S. PATENT DOCUMENTS

| | | | |
|---|---|---|---|
| 5,781,005 A * | 7/1998 | Vig | G01D 5/147 324/207.2 |
| 6,288,533 B1 | 9/2001 | Haeberli et al. | |
| 6,545,462 B2 | 4/2003 | Schott et al. | |
| 6,917,193 B1 | 7/2005 | Howard et al. | |
| 7,009,384 B2 | 3/2006 | Heremans et al. | |
| 7,906,961 B2 | 3/2011 | Abwa et al. | |
| 8,878,524 B2 | 11/2014 | Heberle | |
| 9,267,781 B2 | 2/2016 | Ausserlechner | |

(Continued)

FOREIGN PATENT DOCUMENTS

| | | |
|---|---|---|
| DE | 40 25 837 A1 | 2/1992 |
| DE | 44 18 151 A1 | 12/1994 |

(Continued)

OTHER PUBLICATIONS

Konrad Reif (ed), Bordnetze, Sensoren und electronische Systeme (On-Board Networks, Sensors, and Electronic Systems), ISBN: 978-3-8348-9902-t, p. 288 (2011).

*Primary Examiner* — Noam Reisner
(74) *Attorney, Agent, or Firm* — Muncy, Geissler, Olds & Lowe, P.C.

(57) ABSTRACT

A magnetic field measuring device having a semiconductor body with a first surface running in an x-y plane, with a first and second magnetic field sensor disposed on the surface, and an axis of symmetry, which runs perpendicular to the first surface in the z-direction and to which the magnetic field sensors are positioned in a mirrored fashion, first and second magnets, which are spaced apart from one another and in each case have an axis and a polar surface running perpendicular to the axis and facing the semiconductor body. The magnetic polarity changes along the axes on a surface, whereby the axes run in the direction of the axis of symmetry, whereby the axis of symmetry runs between the axes of the magnets, whereby the surfaces of the magnets in each case are spaced apart in the z-direction to the first surface of the semiconductor body.

15 Claims, 3 Drawing Sheets

(56) References Cited

U.S. PATENT DOCUMENTS

| | | | |
|---|---|---|---|
| 2003/0178990 A1* | 9/2003 | Dufour | G01D 5/147 |
| | | | 324/207.2 |
| 2007/0290678 A1 | 12/2007 | Herrmann et al. | |
| 2009/0295382 A1 | 12/2009 | Sterling | |
| 2009/0322325 A1 | 12/2009 | Ausserlechner | |
| 2013/0154618 A1 | 6/2013 | Heberle | |
| 2015/0142376 A1 | 5/2015 | Ausserlechner | |
| 2015/0331070 A1* | 11/2015 | Koeck | G01D 5/145 |
| | | | 324/252 |

FOREIGN PATENT DOCUMENTS

| | | |
|---|---|---|
| DE | 196 22 561 A1 | 12/1998 |
| DE | 199 46 935 A1 | 5/2001 |
| DE | 10 2012 2221 327 A1 | 5/2014 |
| DE | 10 2014 116 826 A1 | 5/2015 |
| DE | 10 2014 116 842 A1 | 6/2015 |
| DE | 10 2005 060 713 B4 | 1/2019 |
| EP | 1 182 461 A2 | 2/2002 |
| EP | 0 916 074 B1 | 7/2003 |
| EP | 2 085 750 A2 | 8/2009 |
| EP | 2 584 304 A1 | 4/2013 |
| EP | 2 607 857 A2 | 6/2013 |
| WO | WO 2012/168635 A1 | 12/2012 |

\* cited by examiner

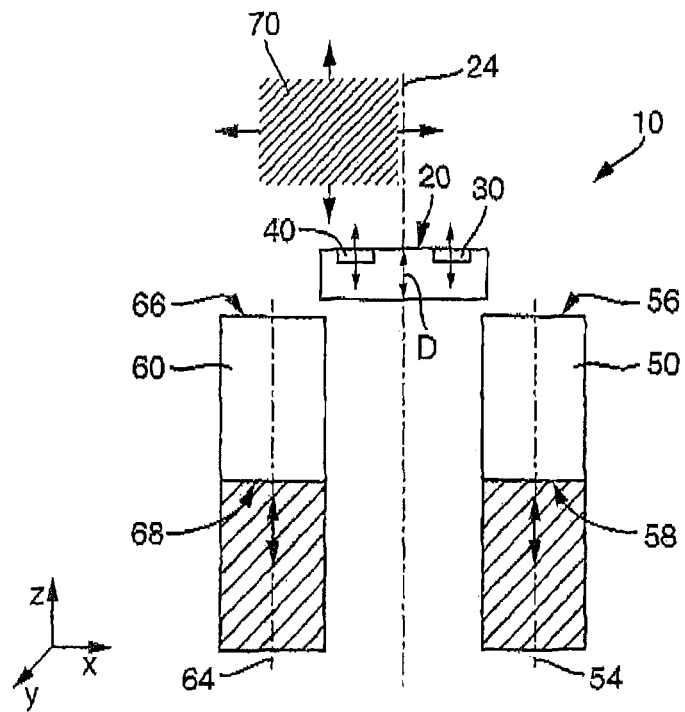
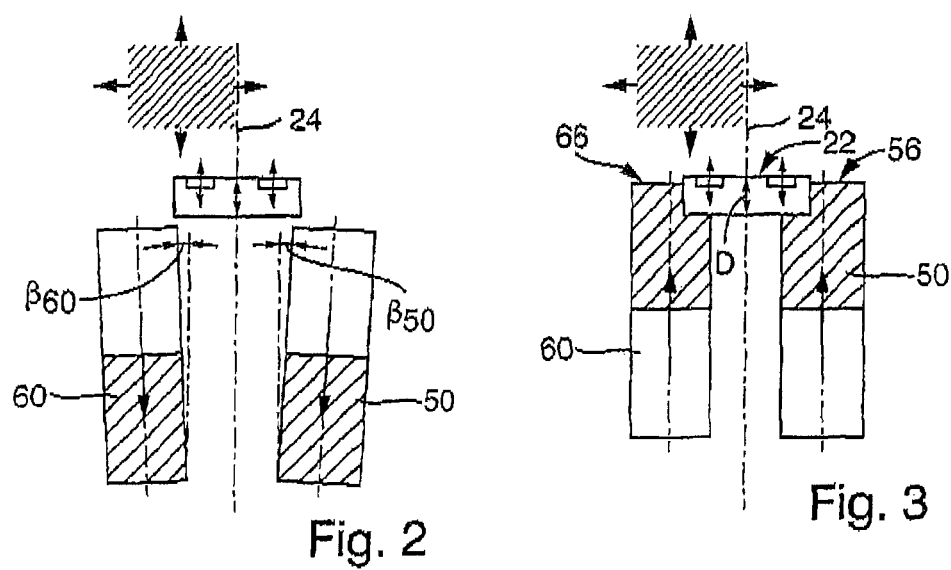
Fig. 1
Fig. 2
Fig. 3

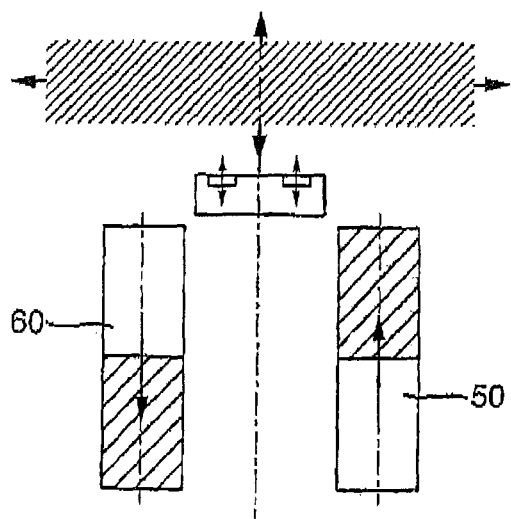
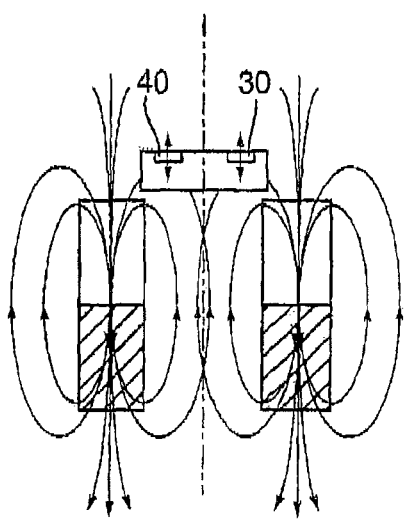
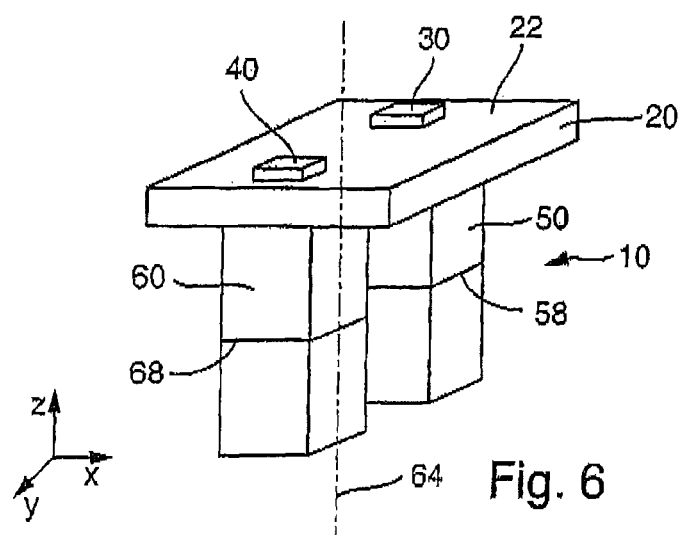

MAGNETIC FIELD MEASURING DEVICE

This nonprovisional application claims priority under 35 U.S.C. § 119(a) to German Patent Application No. 10 2015 013 022.6, which was filed in Germany on Oct. 9, 2015, and which is herein incorporated by reference.

BACKGROUND OF THE INVENTION

Field of the Invention

The invention relates to a magnetic field measuring device.

Description of the Background Art

An arrangement of a Hall sensor and a magnet is known from EP 2 607 857 A2, which corresponds to US 2013/0154618, which is incorporated herein by reference, whereby a Hall voltage is generated by bringing a ferromagnetic plate closer in the Hall sensor.

Further, various approaches to designing a magnetic field measuring device are known from EP 0 916 074 B1 (which corresponds to U.S. Pat. No. 6,288,533), EP 1 182 461 A2 (which corresponds to U.S. Pat. No. 6,545,462), EP 2 584 304 A1 (which corresponds to U.S. Pat. No. 8,878,524 and is herein incorporated by reference), DE 199 46 935 A., U.S. Pat. No. 6,917,193 B1, WO 2012/168635 A1, DE 10 2014 116 842 A1 (which corresponds to U.S. Pat. No. 9,267,781), and DE 10 2014 116 826 A1 (which corresponds to US 20150142376). A generic arrangement is also known from Reifand and Konrad (eds.), Bordnetze, Sensoren and elektronische Systeme [On-board Networks, Sensors, and Electronic Systems], 2011, p. 288, ISBN 978-3-8348-9902-6.

SUMMARY OF THE INVENTION

It is therefore an object of the invention to provide a device that refines the prior art.

According to an exemplary embodiment of the invention, a magnetic field measuring device is provided having a semiconductor body, a first magnet, and a second magnet. The semiconductor body has a first surface running in a first x-y plane and an axis of symmetry running perpendicular to the first surface, in the z-direction, whereby the semiconductor body has a first magnetic field sensor and a second magnetic field sensor on the surface, whereby the first magnetic field sensor is positioned mirrored to the second magnetic field sensor with respect to the axis of symmetry, whereby the first and second magnetic field sensors each measure a z-component of a magnetic field, and whereby the x-direction and the y-direction and the z-direction are each formed orthogonal to one another.

The first and second magnets each can have an axis and a first pole surface running perpendicular to the axis and facing the semiconductor body, whereby the magnetization direction runs along the axis in each case and thereby the magnetic polarity changes on a surface from north to south or vice versa, whereby the axes each run in the direction of the axis of symmetry, whereby the two magnets are spaced apart from one another, whereby the axis of symmetry runs between the axis of the first magnet and the axis of the second magnet, and whereby the surface of the first magnet and the surface of the second magnet are spaced apart in each case in the z-direction from the first surface of the semiconductor body.

The surface on which the magnetic polarity changes can be formed totally within the particular magnet. The magnetic field measuring device can be configured preferably to detect exclusively a component, formed in the z-direction, of the magnetic field of both magnets. The magnets in an arrangement of this type can also be called "back-bias" magnets. For this purpose, the magnetic field of both magnets must be modulated by means of a ferromagnetic body, an encoder, such that the magnetic field lines of the magnets are deflected from the quiescent state in the x-y plane at least partially in the z-direction. It is preferred to produce magnetic field components arising in the z-direction by means of a ferromagnetic plate spaced apart in the z-direction.

It is preferred, further, that without the ferromagnetic body, formed as an encoder, or plate spaced apart in the z-direction, no or substantially no z-component of the magnetic field of the two magnets is formed. The goal of the arrangement is to achieve as far as possible a so-called zero field design; i.e., the particular z-component of the magnets is not measurable or virtually not measurable by the magnetic field sensors without an encoder. The term "substantially" emphasizes the very low field strength of the z-component at the site of the magnetic field sensors; i.e., the field strength of the z-component should not be measurable. The magnitude of the magnetic field strength of the x- and y-components is not considered in this case.

With the addition of the encoder, the measuring device can be refined further to form a magnetic field system. The magnitude of the deflection of the magnetic field lines from the x-y plane by the ferromagnetic body at a small distance in the z-direction is substantially greater than at a greater distance. It should also be noted that apart from AMR, GMR, and TMR, Hall sensors are also included as magnetic field sensors, in particular in the embodiment as Hall plates formed in the x-y plane.

An advantage of the device of the invention is that by the positioning of two magnets, spaced apart from one another, the background field at the magnetic field sensors is greatly reduced. In particular, the distorting effect of production-related and temperature-related deviations between the two magnetic field sensors and the differential error signals resulting therefrom are reduced. Tests have shown that in particular in the Hall sensors a synchronization via temperature (so-called matching) that is better than ±3% is difficult to achieve. In 100 mT magnetic fields, for example, of an individual back-bias magnet, disposed according to the prior art, an offset voltage between two magnetic field sensors already results which corresponds to a differential signal of 3 mT and hereby is in the range of the measurement signals. By the dividing into two magnets, with a suitable arrangement of the particular magnet to the particular magnetic field sensor, the matching between the magnetic field sensors can be substantially improved and the value of the so-called pre-induction (corresponds to the absolute magnetic flux at the two magnetic field sensors without a ferromagnetic encoder or without a target) can be reduced substantially from the hitherto about 50 to above 200 mT to below 20 mT, preferably below 5 mT, and most preferably below 1 mT. In this way, the sensitivity of the magnetic field sensors or of the measuring system for the z-component of the magnetic field can be greatly increased.

At the same time, an increase in the measurement signal is achieved at the same volume of the magnetic material employed. The signal range increases as soon as a z-component at the magnetic field arises by a deflection of the field lines from the quiescent position in the x-y plane.

In an embodiment, the magnetization of the first magnet and of the second magnet runs parallel to one another in the z-direction. Due to a parallel orientation, in the same direction, of the magnetization, a change of the magnetic flux density in the z-direction can be detected by a ferromagnetic encoder not positioned symmetrically to the magnetic field measuring device. The polarity changes on the surfaces in the z-direction, for example, in each case from a south pole to a north pole or vice versa.

In an embodiment, the magnetization direction of the one magnet in the z-direction and that of the other magnet run opposite to the z-direction. An opposite course of the magnetization enables detection of a change in the magnetic flux density in the z-direction for a ferromagnetic encoder oriented symmetrically to the magnetic field measuring device. The polarity on the surface of the one magnet changes in the z-direction from a south pole to a north pole, whereas the polarity on the surface of the other magnet changes in the z-direction from a north pole to a south pole.

In an embodiment, the axis of the first magnet and the axis of the second magnet in each case run substantially or exactly parallel to the axis of symmetry of the semiconductor body.

In an embodiment, the axis of the first magnet and the axis of the second magnet each run at an angle between +45° and −45° to the axis of symmetry of the semiconductor body, whereby the axes run particularly preferably substantially or exactly mirrored to one another. The axes each have the same angle to the axis of symmetry numerically due to axis mirroring relative to the axis of symmetry, but the respective angles have opposite signs.

In an embodiment, the first polar surface of the first magnet and the first polar surface of the second magnet in each case in the z-direction are substantially or exactly flush with the first surface of the semiconductor body, as a result of which an especially compact and small outer dimension of the magnetic field device is achieved. Preferably, the magnets each have a recess partially corresponding to the outer form of the semiconductor body and surround the semiconductor body in each case on a side surface adjacent to the first surface totally and partially on a bottom side lying opposite to the first surface.

In an embodiment, the first polar surface of the first magnet and the first polar surface of the second magnet have a substantially or exactly the same distance to the first surface of the semiconductor body in the z-direction, whereby the distance is preferably smaller than or equal to twice a thickness of the semiconductor body in the z-direction.

In an embodiment, in a projection in the z-direction a projection surface of the first magnetic field sensor overlaps partially or totally with the projection surface of the first polar surface of the first magnet and the projection surface of the second magnetic field sensor with the projection surface of the first polar surface of the second magnet in the projection plane running in an x-y plane.

In an embodiment, in a projection in the z-direction the projection surface of the first magnetic field sensor is adjacent to the projection surface of the first polar surface of the first magnet and the projection surface of the second magnetic field sensor to the projection surface of the first polar surface of the second magnet in the projection plane running in an x-y plane.

In an embodiment, the semiconductor body has an integrated circuit and the integrated circuit is operatively connected to the two magnetic field sensors.

In an embodiment, the magnetic field sensors can be formed as Hall sensors, in particular as Hall plates.

A further subject of the invention is a use of a magnetic field measuring device of the above-described type for detecting a ferromagnetic encoder spaced apart in the z-direction. In a parallel magnetization of the two magnets, the encoder is preferably disposed next to the axis of symmetry. If the encoder is made as a plate, whereby the axis of symmetry penetrates the plate, the magnetization direction of the two magnets is preferably to be made antiparallel.

In an embodiment, the distance of the axes of the first magnet and the second magnet to the axis of symmetry is selected such that in a projection along the axis of symmetry, the two polar surfaces have a greater distance to the axis of symmetry than the projection surface of the two magnetic field sensors.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a schematic view of a first embodiment of the invention of a magnetic field measuring device;

FIG. 2 shows a schematic view of a second embodiment of the invention of a magnetic field measuring device;

FIG. 3 shows a schematic view of a third embodiment of the invention of a magnetic field measuring device;

FIG. 4 shows a schematic view of a fourth embodiment of the invention of a magnetic field measuring device;

FIG. 5 shows a schematic illustration of a magnetic field course;

FIG. 6 shows a perspective view of a first embodiment of a magnetic field measuring device.

DETAILED DESCRIPTION

Figure 7:
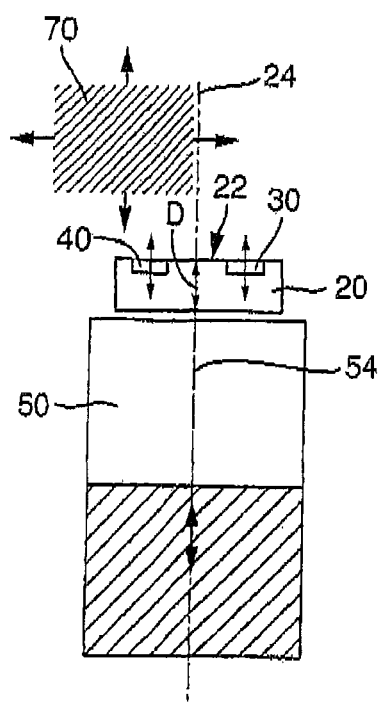
FIG. 7 shows a schematic view of a magnetic field measuring device according to the conventional art.

The illustration in FIG. 1 shows a view of a first embodiment of a magnetic field measuring device 10, having a semiconductor body 20 with a first surface 22, which extends in a first x-y plane and on which a first magnetic field sensor 30 and a second magnetic field sensor 40 are disposed. Magnetic field sensors 30 and 40 are each made as Hall plates and in the present case are formed close to the first x-y plane. Semiconductor body 20 has an axis of symmetry 24, which extends in a z-direction perpendicular to surface 22. Both magnetic field sensors 30 and 40 are disposed at positions mirrored with respect to axis of symmetry 24.

Magnetic field measuring device 10 further has a first magnet 50 and a second magnet 60. The two magnets 50, 60 each have an axis 54, 64, whereby axes 54, 64 each run in the direction of axis of symmetry 24 and axis of symmetry 24 runs between the two axes 54, 64. The magnetic polarity changes in each case along axes 54, 64 on a particular surface 58, 68 from a north pole to a south pole or vice versa, whereby the polarity in this exemplary embodiment changes in a parallel fashion in both magnets 50, 60. Magnets 50, 60 each have a first polar surface 56, 66 facing semiconductor body 20.

In the illustrated exemplary embodiment, the two polar surfaces 56, 66 each run in an x-y plane and the two axes 54, 64 are parallel to axis of symmetry 24 and are arranged spaced apart from it. The distance of axis 54 of first magnet 50 to axis of symmetry 24 is selected such that in a projection along axis of symmetry 24, projection surface of magnet 50 or polar surface 56 has a greater distance to axis of symmetry 24 than the projection surface of magnetic field sensor 30, whereby the two projection surfaces only have a small distance to one another. The same applies to second magnet 60 in regard to magnetic field sensor 40. The two axes 54, 64 run in a mirrored fashion with respect to axis of symmetry 24.

The two polar surfaces 56, 66 along axis of symmetry 24 have a distance to first surface 22 of semiconductor body 20 that is smaller than a thickness D of semiconductor body 20 along axis of symmetry 24.

Disposed in the z-direction is a ferromagnetic encoder 70, which is spaced apart from magnetic field measuring device 10 and which is positioned asymmetrically in particular to axis of symmetry 24. Ferromagnetic encoder 70, for example, a plate, preferably has a magnetically soft design and can also be referred to as a target. The location of encoder 70 is variable in the x- and z-direction as indicated by the arrows. Magnetic field lines are not shown here for reasons of clarity. The magnetic field lines are deflected in the direction of the z-axis due to the target.

A magnetic field course achieved by the embodiment shown here is shown schematically in the illustration in FIG. 5 and illustrates the reduction or the absence of a z-component of the static magnetic field in the area of magnetic field sensors 30, 40.

In the illustration in FIG. 6, a perspective view of the above-described exemplary embodiment is drawn in addition.

A further embodiment of magnetic field measuring device 10 is shown in the illustrations of FIGS. 2, 3, and 4. Only the differences from the illustration in FIG. 1 will be explained below in each case.

Magnetic field device 10, shown in the illustration in FIG. 2, has two magnets 50, 60, the axes 54, 64 of which each have an angle $\beta_{50}$, $\beta_{60}$ to axis of symmetry 24, whereby both axes 54, 64 run mirrored to one another with respect to axis of symmetry 24.

Magnetic field device 10, shown in the illustration in FIG. 3, has two magnets 50, 60, whose first polar surface 56, 66 in each case is substantially flush with surface 22 of semiconductor body 20, whereby in a projection in the z-direction the projection surface of magnetic field sensors 30, 40 in each case overlaps partially with the projection surface of one of the two magnets 50, 60. To this end, the two magnets 50, 60 each have a recess on an edge, facing axis of symmetry 24, of polar surface 56, 66, whereby the recess has a depth in the z-direction, which corresponds to the thickness D of the semiconductor body.

Magnetic field device 10, shown in the illustration in FIG. 4, has two magnets 50, 60, whose polarity changes along axis of symmetry 24 in the opposite direction, therefore for the one magnet from a north pole to a south pole and for the other magnet from a south pole to a north pole.

A magnetic field measuring device according to the state of the art is shown in the illustration in FIG. 7. Only the differences from the illustration in FIG. 1 will be explained below.

The shown magnetic field measuring device has only a first magnet 50, whose axis 54 coincides with the axis of symmetry of the semiconductor body.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic field measuring device comprising:
   a semiconductor body with a first surface running in a first x-y plane, a second surface parallel to the first surface, and an axis of symmetry running perpendicular to the first surface in a z-direction, the semiconductor body having a first magnetic field sensor and a second magnetic field sensor integrally formed on the first surface, the first magnetic field sensor being positioned opposite the second magnetic field sensor along the x-direction with respect to the axis of symmetry, the first and second magnetic field sensors each measuring a z-component of a magnetic field, and the x-direction and the y-direction and the z-direction each being formed orthogonal to one another;
   a first magnet with a first axis and a first polar surface perpendicular to the first axis and wherein the first polar surface facing the semiconductor body, a magnetic polarity changing along the first axis, and the first axis being parallel to the axis of symmetry; and
   a second magnet spaced apart from the first magnet along the x-direction, wherein a space between the first magnet and the second magnet is not filled with ferromagnetic material such that the first magnet and the second magnet are spaced apart by an air gap, the second magnet having a second axis and a second polar surface perpendicular to the second axis and wherein the first polar surface facing the semiconductor body, a magnetic polarity changing along the second axis, and the second axis being parallel to the axis of symmetry,
   wherein the first surface of the first magnet and the first surface of the second magnet have an equal magnetic polarity and wherein both surfaces have a homogeneous magnetic polarity,
   wherein the magnet field is generated only by the first magnet and the second magnet,
   wherein the first magnet and the second magnet are spaced apart from the semiconductor body such that magnetic field lines emitted or received at the first polar surface and the second polar surface are substantially parallel to the first x-y plane of the semiconductor body at the first surface of the semiconductor body,
   wherein the axis of symmetry runs between the axis of the first magnet and the axis of the second magnet,
   wherein the first polar surface of the first magnet and the second polar surface of the second magnet are each spaced apart in the z-direction from the first surface of the semiconductor body and the second surface of the semiconductor body,
   wherein the air gap between the first magnet and the second magnet are larger than the distance between the first magnetic field sensor and the second magnetic field sensor,
   wherein the first magnetic field sensor and second magnetic field sensor are formed as Hall sensors, the first magnetic field sensor and second magnetic field sensor, when synchronized or matched, have less than 3% deviation from each other, wherein the first magnet and the second magnet are spaced apart from the first magnetic field sensor and from the second magnetic field sensor such that no or substantially no z-component of the magnetic field of the two magnets is formed in an area of the two magnetic field sensors for detecting a ferromagnetic encoder spaced apart in the z-direction, wherein the first magnet has a first centroidal axis intersecting the first polar surface and the second polar surface of the first magnet and the second magnet has a second centroidal axis intersecting the first polar surface and the second polar surface of the second magnet, wherein the first magnetic field sensor and second magnetic field sensor are both disposed entirely between the first centroidal axis and the second centroidal axis, wherein the first magnet sensor and the second magnet sensor are connected solely by the semiconductor body, and wherein magnetic polarity of the first magnet and of the second magnet changes in a parallel fashion in the z-direction across a first lateral surface of the first magnet and a second lateral surface of the second magnet.

2. The magnetic field measuring device according to claim 1, wherein the first axis of the first magnet and the second axis of the second magnet in each case run substantially or exactly parallel to the axis of symmetry of the semiconductor body.

3. The magnetic field measuring device according to claim 1, wherein the first axis of the first magnet and the second axis of the second magnet each run at an angle between +45° and −45° to the axis of symmetry of the semiconductor body.

4. The magnetic field measuring device according to claim 1, wherein the first axis of the first magnet and the second axis of the second magnet run substantially or exactly mirrored to one another with respect to the axis of symmetry of the semiconductor body.

5. The magnetic field measuring device according to claim 1, wherein the first polar surface of the first magnet and the second polar surface of the second magnet in each case in the z-direction are substantially or exactly flush with the first surface of the semiconductor body.

6. The magnetic field measuring device according to claim 1, wherein the first polar surface of the first magnet and the second polar surface of the second magnet have a substantially or exactly the same distance to the first surface of the semiconductor body in the z-direction.

7. The magnetic field measuring device according to claim 6, wherein the same distance of the first polar surface of the first magnet and the second polar surface of the second magnet to the first surface is smaller than or equal to twice a thickness of the semiconductor body in the z-direction, and wherein the same distance is a second air gap.

8. The magnetic field measuring device according to claim 1, wherein the first magnetic field sensor and the second magnetic field sensor each have a width in the z-direction, wherein the width of the first magnetic field sensor overlaps partially or totally with a first projection of the first polar surface of the first magnet, and wherein the width of the second magnetic field sensor overlaps partially or totally with a second projection of the second polar surface of the second magnet in a projection plane parallel in an x-y plane.

9. The magnetic field measuring device according to claim 1, wherein the first magnetic field sensor and the second magnetic field sensor each have a lateral surface in the z-direction, wherein a lateral surface of the first magnetic field sensor is adjacent to a first projection surface of the first polar surface of the first magnet, and wherein a lateral surface of the second magnetic field sensor is adjacent to a second projection surface of the second polar surface of the second magnet in a projection plane in a x-y plane.

10. The magnetic field measuring device according to claim 1, wherein the semiconductor body has an integrated circuit and the integrated circuit is operatively connected to the two magnetic field sensors.

11. The magnetic field measuring device according to claim 1, wherein the magnetic field sensors are made as Hall plates.

12. The magnetic field measuring device according to claim 1, wherein a distance between the first axis and the second axis of the first magnet and the second magnet to the axis of symmetry is selected such that in the z-direction, the first and second polar surfaces have a greater distance to the axis of symmetry than to lateral surfaces of the first and second magnetic field sensors.

13. The magnetic field measuring device according to claim 1, wherein the first magnetic field sensor and the second magnetic field sensor, when synchronized or matched, measure less than 20 mT of absolute magnetic flux in the z-direction prior to induction by an encoder.

14. The magnetic field measuring device according to claim 1, wherein the first magnetic field sensor and the second magnetic field sensors, when synchronized or matched, measure less than 5 mT of absolute magnetic flux in the z-direction prior to induction by an encoder.

15. The magnetic field measuring device according to claim 1, wherein the semiconductor body is spaced apart from the first magnet and the second magnet.

* * * * *